(12) United States Patent
Kuwabara

(10) Patent No.: US 9,093,346 B2
(45) Date of Patent: Jul. 28, 2015

(54) PHOTOELECTRIC CONVERSION DEVICE AND IMAGING SYSTEM

(71) Applicant: CANON KABUSHIKI KAISHA, Tokyo (JP)

(72) Inventor: Hideshi Kuwabara, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/322,158

(22) Filed: Jul. 2, 2014

(65) Prior Publication Data

US 2015/0028401 A1    Jan. 29, 2015

(30) Foreign Application Priority Data

Jul. 25, 2013    (JP) .................... 2013-154961

(51) Int. Cl.
*H01L 31/062*    (2012.01)
*H01L 27/146*    (2006.01)
*H01L 31/00*    (2006.01)

(52) U.S. Cl.
CPC .... *H01L 27/14643* (2013.01); *H01L 27/14603* (2013.01)

(58) Field of Classification Search
CPC .................... H01L 27/14643; H01L 27/14603
USPC .................. 257/290, 291, 292, 443, E27.131, 257/E27.132, E31.032, E31.124; 438/48, 438/59, 70, 73; 136/244, 249
See application file for complete search history.

(56) References Cited

U.S. PATENT DOCUMENTS

| | | | |
|---|---|---|---|
| 6,084,259 A * | 7/2000 | Kwon et al. | 257/292 |
| 6,894,268 B2 * | 5/2005 | Ohkawa | 250/214.1 |
| 7,745,860 B2 * | 6/2010 | Inoue et al. | 257/292 |
| 8,319,166 B2 | 11/2012 | Kawahito | |
| 8,558,293 B2 | 10/2013 | Kawahito et al. | |
| 2007/0051989 A1 * | 3/2007 | Rhodes | 257/290 |
| 2008/0258188 A1 * | 10/2008 | Kao | 257/292 |
| 2009/0261392 A1 * | 10/2009 | Tatani | 257/290 |
| 2010/0025569 A1 * | 2/2010 | Matsumoto et al. | 250/208.1 |
| 2012/0199934 A1 | 8/2012 | Onuki et al. | |

FOREIGN PATENT DOCUMENTS

| | | | |
|---|---|---|---|
| JP | 2005-223146 A | 8/2005 | |
| JP | 2007-073770 A | 3/2007 | |
| JP | 2011-082427 A | 4/2011 | |
| WO | 2006/097978 A1 | 9/2006 | |
| WO | 2007/083704 A1 | 7/2007 | |
| WO | 2011/043432 A1 | 4/2011 | |

* cited by examiner

*Primary Examiner* — Dao H Nguyen
(74) *Attorney, Agent, or Firm* — Fitzpatrick, Cella, Harper & Scinto

(57) ABSTRACT

A photoelectric conversion device including a photoelectric conversion element including a first semiconductor region of a first conductivity type, a second semiconductor region of the first conductivity type provided in contact with the first semiconductor region, a third semiconductor region of the first conductivity type provided apart from the second semiconductor region, a fourth semiconductor region of a second conductivity type provided between the second and the third semiconductor region, and a fifth semiconductor region of the first conductivity type provided apart from the third semiconductor region, wherein an impurity concentration of the third semiconductor region is lower than that of the fifth semiconductor region, and a depth of a lower-edge of the third semiconductor region from a surface of the semiconductor substrate is larger than that of a lower-edge of the fifth semiconductor region.

15 Claims, 11 Drawing Sheets

F I G. 10
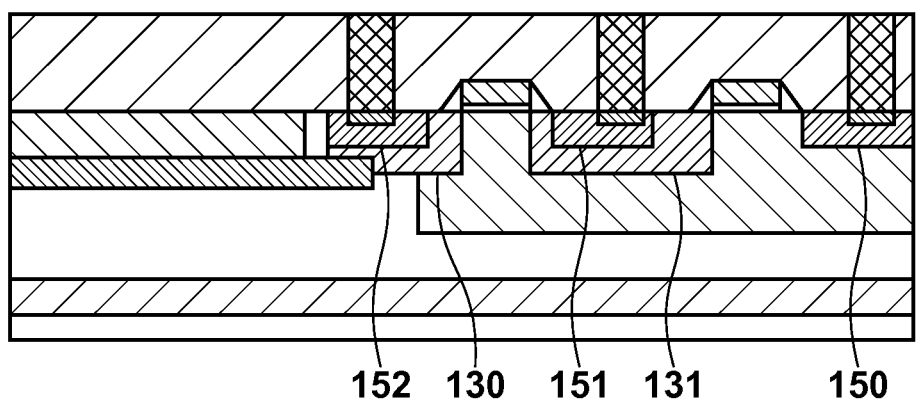
F I G. 11
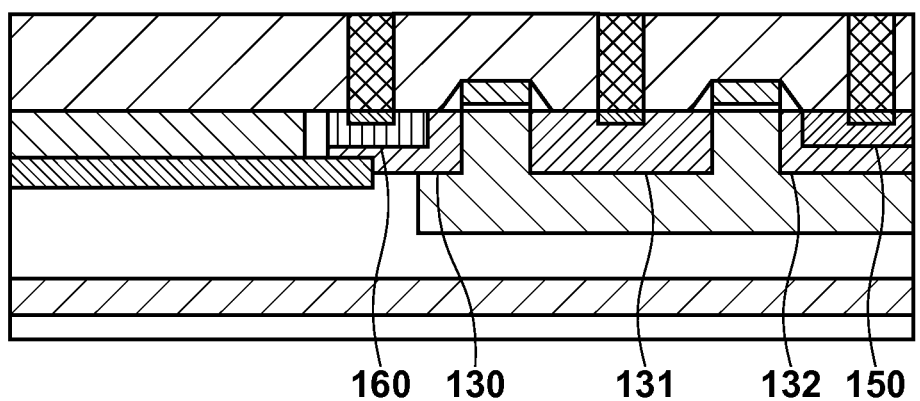

F I G. 12
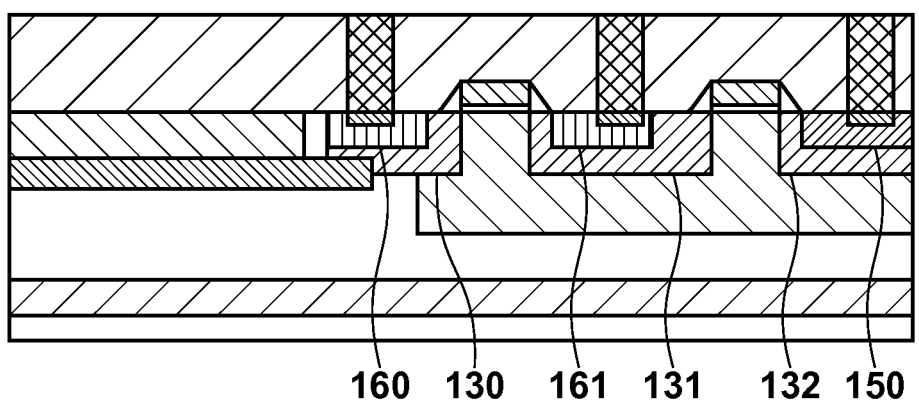
160 130 161 131 132 150
F I G. 13
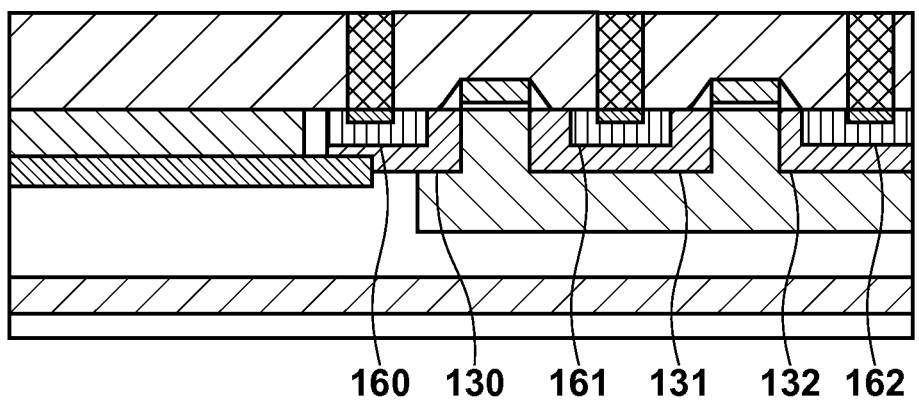
160 130 161 131 132 162

PHOTOELECTRIC CONVERSION DEVICE AND IMAGING SYSTEM

BACKGROUND OF THE INVENTION

1. Field of the Invention

The present invention relates to a photoelectric conversion device and an imaging system.

2. Description of the Related Art

A CMOS sensor including a photoelectric conversion device and transistors is known as a solid-state image sensor. A general structure of a photoelectric conversion device includes a photodiode and a peripheral circuit for reading out an optical signal from the photodiode. In a photoelectric conversion device having such a structure, it is important to suppress a dark current in order to suppress the occurrence of noise. Japanese Patent Laid-Open No. 2005-223146 discloses a technique of suppressing a dark current generated at a diffusion layer end of a reset element contacting a photodiode by covering an impurity region on the photodiode side of the reset element adjacent to the photodiode and an element isolation region with a lightly doped diffusion layer.

SUMMARY OF THE INVENTION

The first aspect of the present invention provides a photoelectric conversion device comprising a photoelectric conversion element provided in a semiconductor substrate and including a first semiconductor region of a first conductivity type, a second semiconductor region of the first conductivity type which is provided in contact with the first semiconductor region, a third semiconductor region of the first conductivity type which is provided at a position apart from the second semiconductor region, a fourth semiconductor region of a second conductivity type different from the first conductivity type which is provided between the second semiconductor region and the third semiconductor region, a fifth semiconductor region of the first conductivity type which is provided at a position apart from the third semiconductor region, a sixth semiconductor region of the second conductivity type which is provided between the third semiconductor region and the fifth semiconductor region, a first gate electrode provided on an insulation film on the fourth semiconductor region, and a second gate electrode provided on an insulation film on the sixth semiconductor region, wherein an impurity concentration of the third semiconductor region is lower than that of the fifth semiconductor region, and a depth of a lower-edge of the third semiconductor region from a surface of the semiconductor substrate is larger than a depth of a lower-edge of the fifth semiconductor region from the surface of the semiconductor substrate.

The second aspect of the invention provides a photoelectric conversion device comprising, a first semiconductor region of a first conductivity type provided in a semiconductor substrate and forming a photoelectric conversion element, a second semiconductor region of the first conductivity type which is provided in contact with the first semiconductor region, a third semiconductor region of the first conductivity type which is provided at a position apart from the second semiconductor region, a fourth semiconductor region of a second conductivity type different from the first conductivity type which is provided between the second semiconductor region and the third semiconductor region, a fifth semiconductor region of the first conductivity type which is provided at a position apart from the third semiconductor region, a sixth semiconductor region of the second conductivity type which is provided between the third semiconductor region and the fifth semiconductor region, a first gate electrode provided on an insulation film on the fourth semiconductor region, and a second gate electrode provided on an insulation film on the sixth semiconductor region, wherein a depth of a lower-edge of the third semiconductor region from a surface of the semiconductor substrate is larger than a depth of a lower-edge of the fifth semiconductor region from the surface of the semiconductor substrate.

The third aspect of the present invention provides an imaging system comprising a solid-state image sensor including a photoelectric conversion device defined above and a processing unit configured to process a signal output from the solid-state image sensor.

Further features of the present invention will become apparent from the following description of exemplary embodiments (with reference to the attached drawings).

BRIEF DESCRIPTION OF THE DRAWINGS

FIG. 10 is a view showing an example of the arrangement of a photoelectric conversion device according to the eighth embodiment;

FIG. 11 is a view showing an example of the arrangement of a photoelectric conversion device according to the ninth embodiment;

FIG. 12 is a view showing an example of the arrangement of a photoelectric conversion device according to the 10th embodiment; and FIG. 13 is a view showing an example of the arrangement of a photoelectric conversion device according to the 11th embodiment.

DESCRIPTION OF THE EMBODIMENTS

The present invention provides a photoelectric conversion device which suppresses a dark current originating from the operation of a transistor provided adjacent to a photoelectric conversion element.

A photoelectric conversion device is used for a solid-state image sensor for imaging or focus detection. For example, a solid-state image sensor for focus detection can have a plurality of operation modes including a high-sensitivity mode and a low-sensitivity mode to change the accuracy of focus detection in accordance with illuminance.

Figure 1:
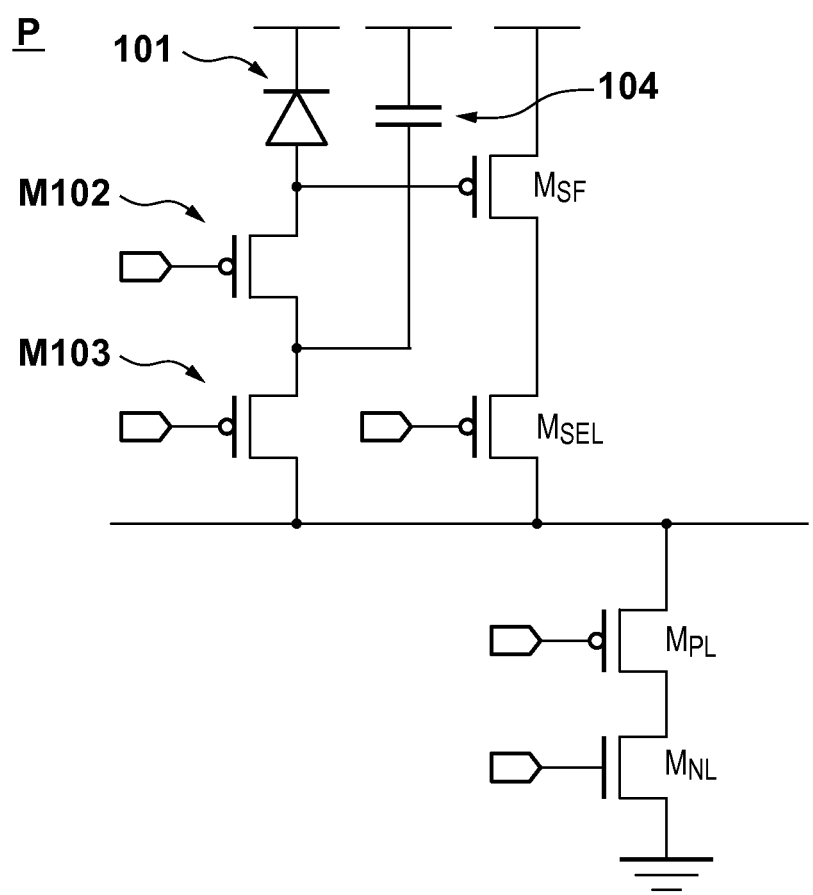
FIG. 1 is a circuit diagram showing an example of the circuit configuration of a photoelectric conversion device.

An example of the circuit of a pixel P of a photoelectric conversion device which can change sensitivity will be described with reference to FIG. 1. The pixel P includes a photoelectric conversion element 101 (photodiode), a MOS transistor 103, a MOS transistor 102, and a capacitive element 104. The anode of the photoelectric conversion element 101 is connected to the gate of a transistor $M_{SF}$. When a transistor $M_{SEL}$ is rendered conductive, a voltage corresponding to the optical signal generated by the photoelectric conversion element 101, that is, the electric charges generated by the photoelectric conversion element 101 is applied to the gate of the transistor $M_{SF}$.

The MOS transistor 102 is a p-channel MOS transistor for sensitivity switching. This transistor is controlled to be non-conductive in the high-sensitivity mode, and conductive in the low-sensitivity mode. While the MOS transistor 102 is conductive, the capacitive element 104 is charged with some of the electric charges generated by the light which has entered the photoelectric conversion element 101. Therefore, a change in the gate voltage of the transistor $M_{SF}$ is reduced. That is, the gate voltage of the transistor $M_{SF}$ changes more when the MOS transistor 102 is in a non-conductive state. This can increase sensitivity.

The MOS transistor 103 is a p-channel MOS transistor connected in series with the MOS transistor 102. The capacitive element 104 is initialized by rendering the MOS transistor 103 conductive. In addition, the photoelectric conversion element 101 and the capacitive element 104 are initialized by rendering the MOS transistors 102 and 103 conductive.

First Embodiment

Figure 2A:
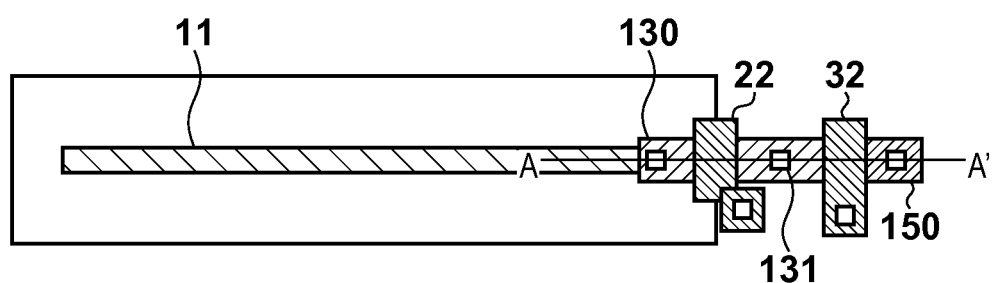
FIGS. 2A and 2B are views showing an example of the arrangement of a photoelectric conversion device according to the first embodiment.
Figure 2B:
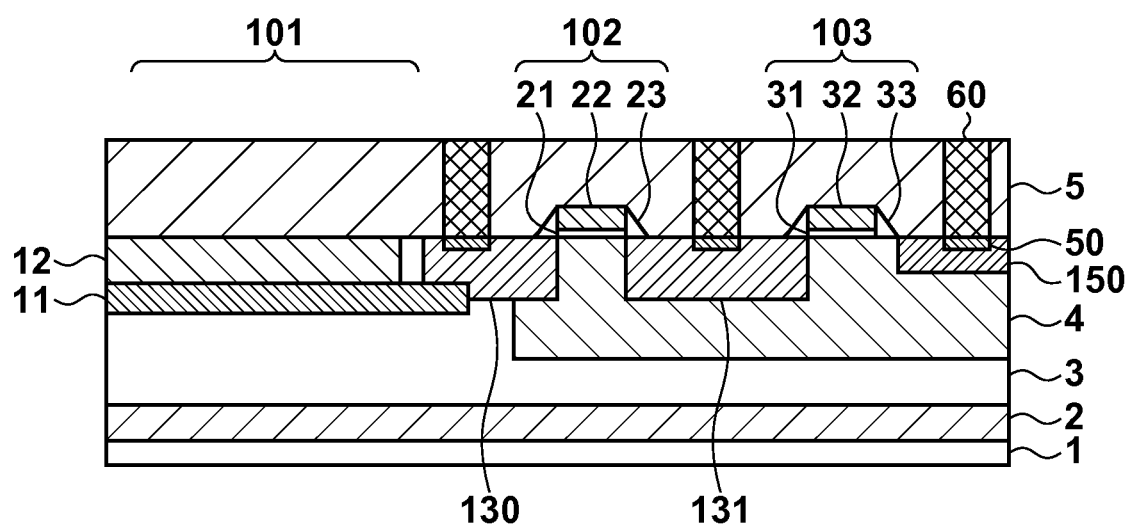

A photoelectric conversion device according to this embodiment will be described with reference to FIGS. 2A to 3J. FIG. 2A is a plan view showing an example of the layout of a photoelectric conversion device according to the first embodiment. FIG. 2B shows a sectional structure taken along a cut line A-A' in FIG. 2A.

The respective elements including a photoelectric conversion element 101, a MOS transistor 102, and a MOS transistor 103 are formed on a semiconductor substrate 1 having, for example, an n-type epitaxial layer 3. The photoelectric conversion element 101 is, for example, a buried photodiode, and is formed from a p-type semiconductor region 11 and an n-type semiconductor region 12. A buried photodiode is also called a pinned photodiode. Assume that the p-type semiconductor region 11 is the first semiconductor region. The MOS transistors 102 and 103 include the respective semiconductor regions provided in an n-type well 4 and gate electrodes 22 and 32 and the like provided on an insulation film on the n-type well 4.

In this embodiment, a p-type semiconductor region 130 as the second semiconductor region forming the source of the MOS transistor 102 is in contact with the p-type semiconductor region 11 of the photoelectric conversion element 101 to form part of the p-type semiconductor region 11. A p-type semiconductor region 131 is provided at a position apart from the p-type semiconductor region 130. Assume that the p-type semiconductor region 131 is a third semiconductor region. The p-type semiconductor region 130 and the p-type semiconductor region 131 can be formed together to have similar depths by ion implantation. A fourth semiconductor region of the second conductivity type (n type) as the opposite conductivity type to the first conductivity type, in which a channel is to be formed, is arranged between the p-type semiconductor region 130 and the p-type semiconductor region 131. The gate electrode 22 for the formation of a channel is provided on a gate oxide film 21 on the semiconductor substrate 1 in which the fourth semiconductor region is arranged. The gate electrode 22 is located between the p-type semiconductor region 130 and the p-type semiconductor region 131. A side wall 23 is formed on a side surface of the gate electrode 22. The p-type semiconductor region 131 forming the source electrode of the MOS transistor 103 is provided apart from a p-type semiconductor region 150 (fifth semiconductor region) forming the drain electrode. A sixth semiconductor region serving as an n-type channel is formed between the p-type semiconductor region 131 and the p-type semiconductor region 150. The fourth and sixth semiconductor regions are formed in a common semiconductor region. The gate electrode 32 for the formation of a channel is provided on a gate oxide film 31 on the semiconductor substrate 1 in which the sixth semiconductor region is placed. The gate electrode 32 is located between the p-type semiconductor region 131 and the p-type semiconductor region 150. A side wall 33 is formed on a side surface of the gate electrode 32. As shown in FIG. 2B, a region under the side wall 33 serves as part of a sixth semiconductor region (n-type region). In this manner, the MOS transistor 103 has a gate offset structure. Using the gate offset structure can reduce the electric field, between the p-type semiconductor region 150 and the sixth semiconductor region, which is generated when, for example, an OFF voltage is applied to the gate electrode 32. A region under the side wall 33 may be used as a sixth semiconductor region. In addition, the gate electrode 22 can be formed into a gate offset structure by using a region under the side wall 23 as a fourth semiconductor region. An interlayer dielectric film 5 covers the photoelectric conversion element 101 and the MOS transistors 102 and 103. Each semiconductor region is connected to a wiring pattern via a contact plug 60. Each contact plug 60 is ohmic-connected to each semiconductor region. An opening for the connection of each contact plug is formed to expose each semiconductor region to which the contact plug is to be connected. The contact plug provided in the p-type semiconductor region 130 is electrically connected to the gate electrode of a transistor $M_{SF}$ via a wiring. The p-type semiconductor regions 130 and 131 are formed to have an impurity concentration lower than that of the p-type semiconductor region 150. Note that the p-type semiconductor region 150 has an impurity concentration that ensures the electrical connection of the contact plug. The p-type semiconductor region 150 is connected to a power supply via the contact plug. When the MOS transistor 103 is rendered conductive, a capacitive element 104 is reset. The p-type semiconductor region 150 is formed in a region, in the semiconductor substrate 1, which is shallower than the p-type semiconductor regions 130 and 131.

In this embodiment, the MOS transistors 102 and 103 are formed such that the impurity concentrations of the sources are lower than that of the drain of the MOS transistor 103 (for example, $\frac{1}{10}$ to $\frac{1}{100}$). When the photoelectric conversion element 101 is to be operated in the low-sensitivity mode, the MOS transistor 102 is rendered conductive, and the MOS transistor 103 is rendered non-conductive. When an OFF voltage is applied to the gate of the MOS transistor 103, a depletion layer is formed between the p-type semiconductor region 131 having a low impurity concentration and a portion adjacent to the channel of the MOS transistor 103. The relationship between the width of the depletion layer and the impurity concentration is given such that the width decreases with an increase in impurity concentration, because as the impurity concentration increases, electrons combine with holes in a narrower region. A depletion layer of a source formed with a normal impurity concentration is relatively narrow, and hence a dark current tends to flow. In contrast to this, forming the p-type semiconductor region 131 having a low impurity concentration will increase the width of the depletion layer. When the same voltage is applied, the electric field at the portion with a depletion layer having a larger width is smaller, and the dark current generated by a tunneling effect is smaller. This makes it possible to reduce a dark current flowing in the photoelectric conversion element 101. The impurity concentration of the p-type semiconductor region 131 of the MOS transistor 103 is set to an impurity concentration that enables resetting of the capacitive element 104 in a predetermined time.

Figure 3A:
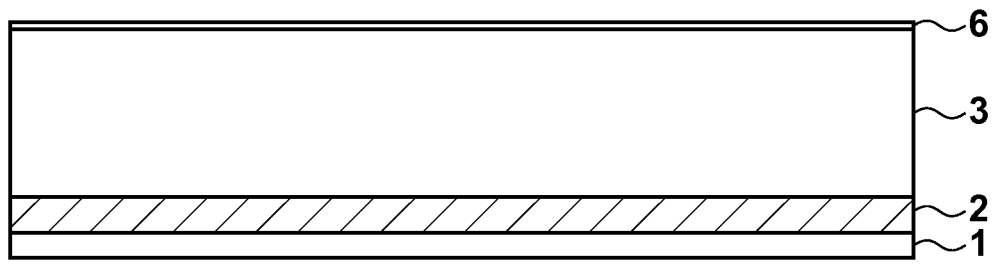
FIGS. 3A to 3J are views showing a method of manufacturing the photoelectric conversion device according to the first embodiment.

A method of manufacturing a photoelectric conversion device according to this embodiment will be described below with reference to FIGS. 3a to 3j. FIG. 3A shows the semiconductor substrate 1 on which a buried region 2 is formed under the epitaxial layer 3. The semiconductor substrate 1 includes the epitaxial layer 3 and the buried region 2. The photoelectric conversion element 101, the MOS transistor 102 for changing sensitivity, and the MOS transistor 103 for resetting the capacitive element will be arranged in the active region of the semiconductor substrate. First of all, a buffer oxide film 6 is formed on the surface of the epitaxial layer 3 of the semiconductor substrate 1.

Figure 3B:
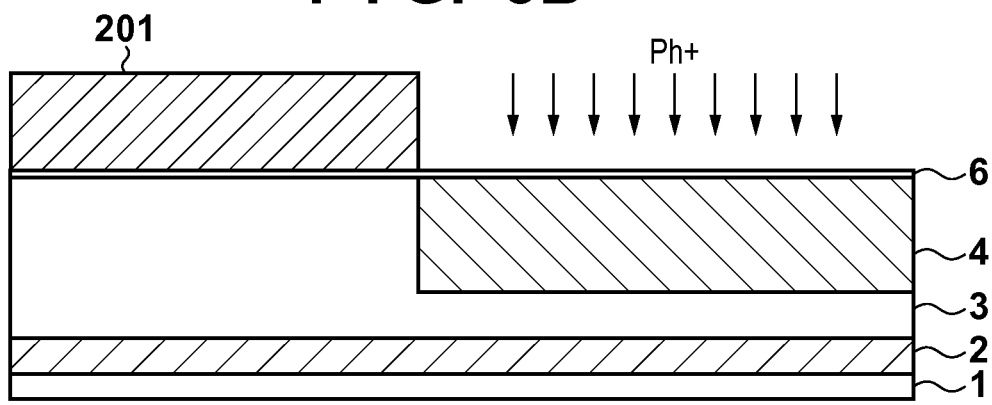
Figure 3C:
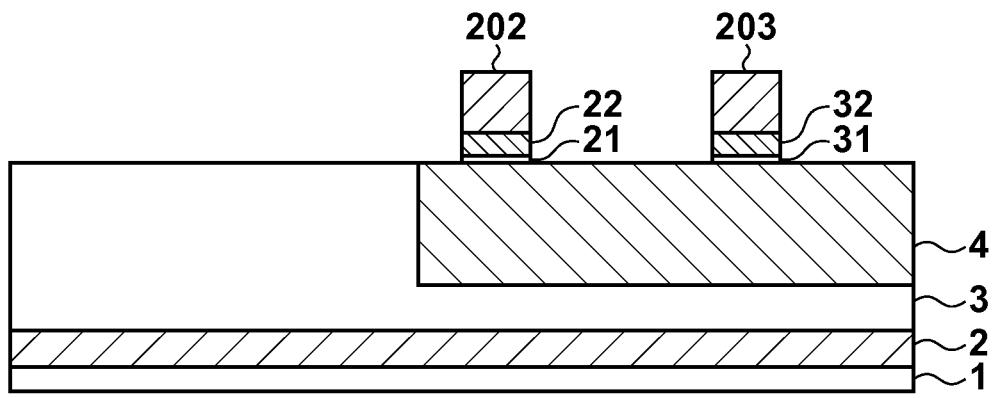

Next, as shown in FIG. 3B, a resist pattern 201 is formed so as to have an opening in a region where the MOS transistors 102 and 103 are to be formed. The n-type semiconductor substrate 4 (n-type well) is formed by ion implantation of an n-type impurity. Subsequently, as shown in FIG. 3C, the resist pattern 201 and the buffer oxide film 6 are removed and gate oxide films 21 and the gate electrodes 22 and 32 made of polysilicon are formed. The gate electrodes 22 and 32 are formed by, for example, forming a polysilicon layer using a CVD method, forming a resist pattern using a photolithography technique, and then patterning the polysilicon layer using an etching technique. In this case, resist patterns 202 and 203 shown in FIG. 3C are formed to form the gate electrodes 22 and 32.

Figure 3D:
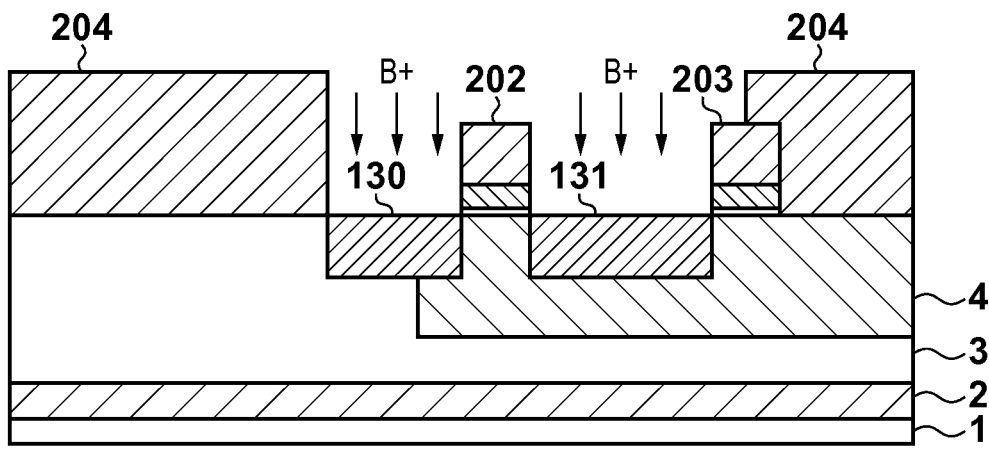

In addition, as shown in FIG. 3D, a resist pattern 204 is formed, and the second p-type semiconductor regions 130 and 131 are formed by self alignment with the gate electrodes. In this forming process, the resist pattern 204 is newly formed, without removing the resists 202 and 203 used for the patterning of the polysilicon layer, to perform ion implantation of an impurity such as boron with a dose of about $3 \times 10^{13}$ cm$^{-2}$ to $9 \times 10^{13}$ cm$^{-2}$ at an implantation energy of about 100 keV. As a result, the p-type semiconductor regions 130 and 131 having similar impurity concentrations are formed to have similar depths. The p-type semiconductor regions 130 and 131 serve as parts of the source and drain electrodes of the MOS transistors 102 and 103.

Figure 3E:
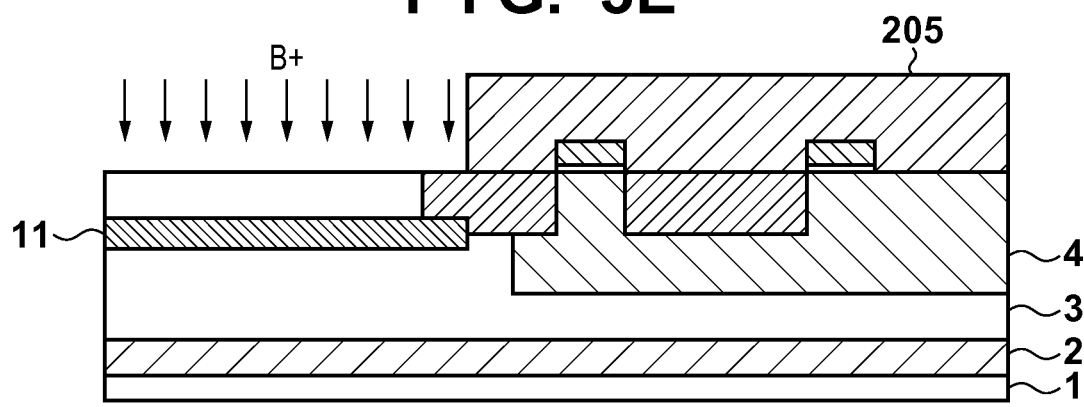
Figure 3F:
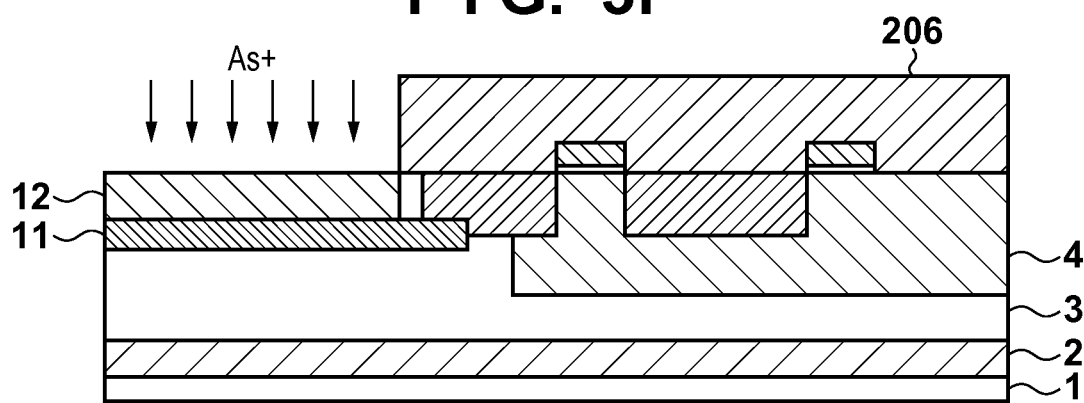

Next, as shown in FIG. 3E, a resist pattern having an opening portion provided at a position for forming the p-type semiconductor region 11 is formed, and an impurity such as boron is implanted with a dose of about $7 \times 10^{11}$ cm$^{-2}$ at an implantation energy of about 150 keV. Subsequently, as shown in FIG. 3F, a resist pattern 206 having an opening at a position for forming the n-type semiconductor region 12 is formed, and the n-type semiconductor region 12 is formed by ion implantation of an impurity such as As (arsenic) with a dose of about $6 \times 10^{12}$ cm$^{-2}$ to $5 \times 10^{13}$ cm$^{-2}$ at an implantation energy of about 110 keV. The lower-edge of the p-type semiconductor region 11 is formed at a larger depth from the surface of the semiconductor substrate than the lower-edges of the p-type semiconductor regions 130 and 131.

Figure 3G:
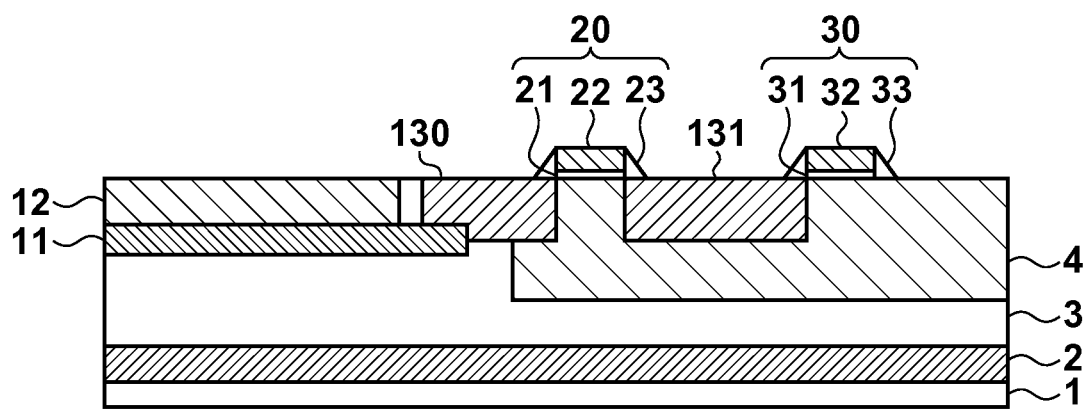
Figure 3H:
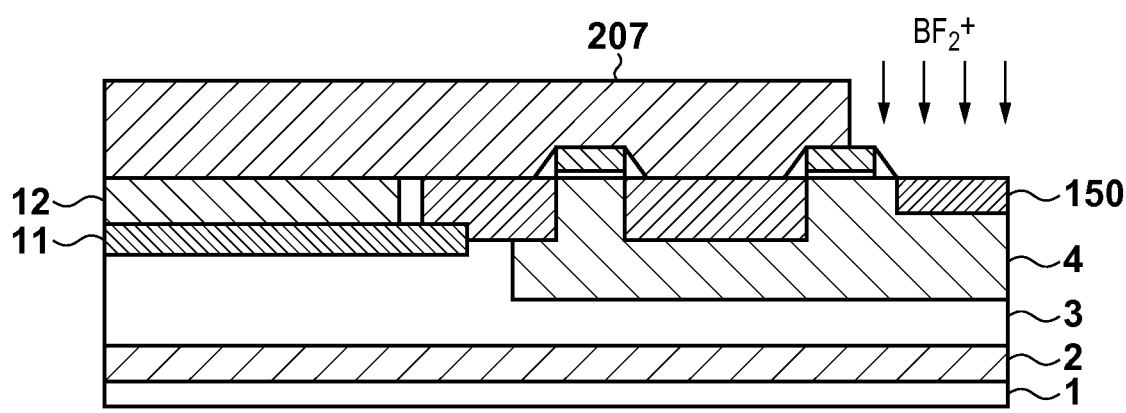
Figure 3I:
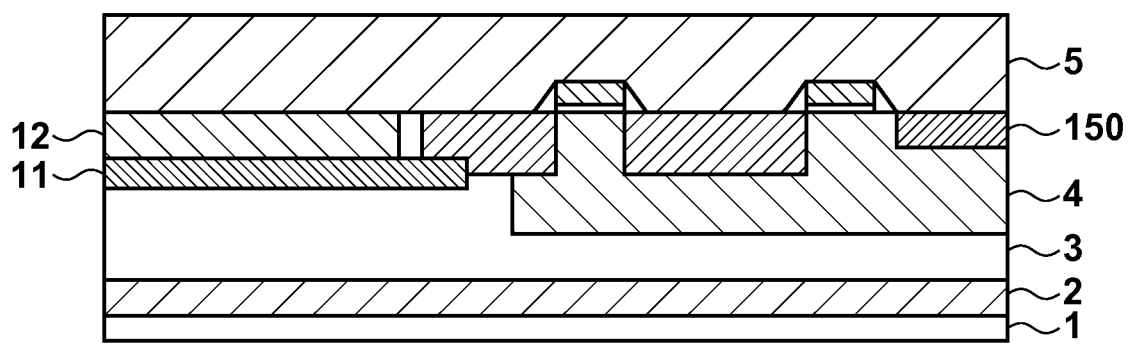
Figure 3J:
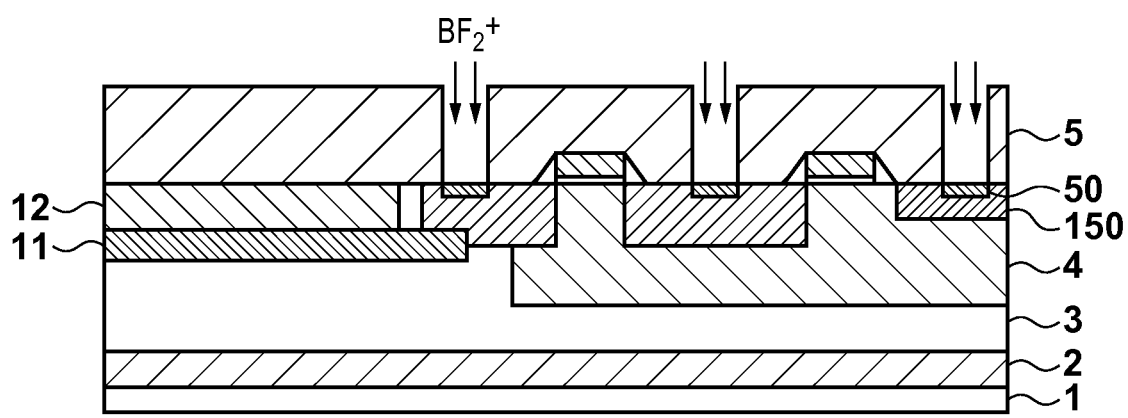

Subsequently, as shown FIG. 3G, side walls are formed on the gate electrodes 22 and 32. The side walls can be formed by, for example, forming an oxide film having a thickness of about 120 nm by a CVD method after removal of the resist pattern 206, and then anisotropically etching the formed oxide film. The oxide film may be a multilayer film of an oxide film and a nitride film. Next, as shown in FIG. 3H, the p-type semiconductor region 150 is formed by ion implantation while performing self alignment using a resist pattern 207 and a side wall. The impurity concentration of the p-type semiconductor region 150 is higher than that of the p-type semiconductor regions 130 and 131. The p-type semiconductor region 150 is a portion serving as the drain electrode of the MOS transistor 103. Ion implantation is performed by using, for example, BF$_2$ with a dose of about $6 \times 10^{14}$ cm$^{-2}$ to $5 \times 10^{15}$ cm$^{-2}$ at an implantation energy of about 40 keV. The lower-edge of the p-type semiconductor region 150 is formed in the n-type semiconductor region 4 of the semiconductor substrate 1 at a shallower position than the lower-edges of the p-type semiconductor regions 130 and 131. Subsequently, the interlayer dielectric film 5 is formed (FIG. 3I), and contact holes are formed. For ohmic connection, for example, ion implantation of BF$_2$ is then performed with a dose of $9 \times 10^{13}$ cm$^{-2}$ to $8 \times 10^{14}$ cm$^{-2}$ at an implantation energy of 40 keV (FIG. 3J). Subsequently, for example, contact plugs are formed, and aluminum wirings are routed. A photoelectric conversion device is manufactured by repeating necessary processes up to the wiring layer on the uppermost layer.

Second Embodiment

Figure 4:
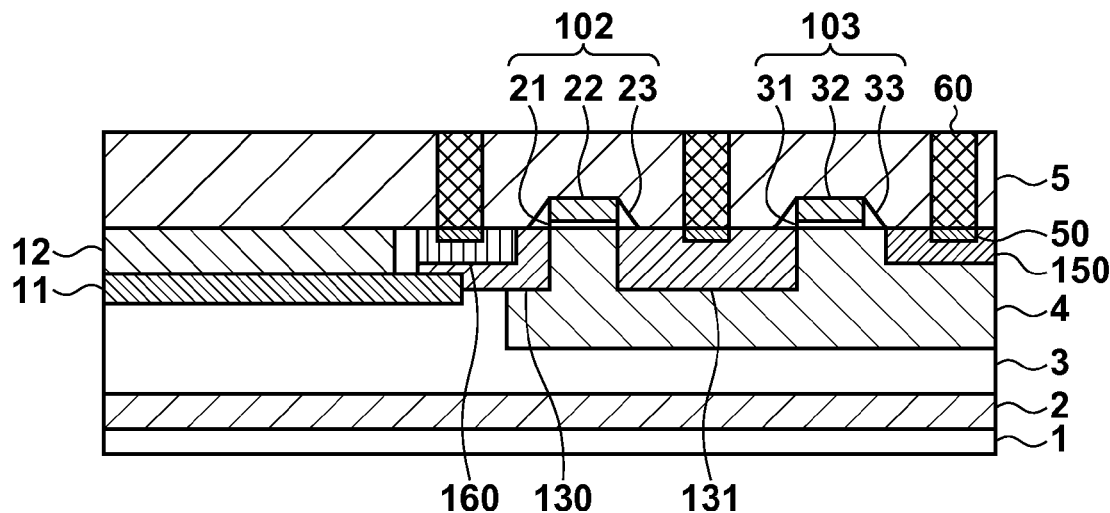
FIG. 4 is a view showing an example of the arrangement of a photoelectric conversion device according to the second embodiment.

As in the first embodiment, in the second embodiment, the impurity concentrations of p-type semiconductor regions 130 and 131 are lower than that of a p-type semiconductor region 150. In the p-type semiconductor region 130, a p-type semiconductor region 160 (seventh semiconductor region) having a higher impurity concentration than the p-type semiconductor region 130 is placed. The p-type semiconductor region 160 is a region where a contact plug is formed. This embodiment will be described with reference to FIG. 4. Different points from the first embodiment will be mainly described below. The impurity concentrations of the p-type semiconductor regions 130 and 131 in this embodiment are similar to, for example, that of the p-type semiconductor region 130 in the first embodiment. The impurity concentration of the p-type semiconductor region 160 is higher than that of the p-type semiconductor region 130 and lower than that of the p-type semiconductor region 150. The p-type semiconductor region 160 is formed to be included in the p-type semiconductor region 130. The p-type semiconductor region 130 is formed to extend from the surface of the semiconductor substrate to a deeper region than the p-type semiconductor region 160. In addition, the p-type semiconductor region 160 is formed such that part of the p-type semiconductor region 130 is arranged between the p-type semiconductor region 160 and the fourth semiconductor region under a gate electrode 22. The p-type semiconductor region 160 can be formed by, for example, forming a resist having an opening corresponding to a portion, of the p-type semiconductor region 130, in which the p-type semiconductor region 160 is to be formed, and then implanting boron ions or the like. Increasing the impurity concentration of the p-type semiconductor region 160 can achieve reliable electrical connection to the contact plug.

Note that the length from an end portion of the gate electrode 22 to an end portion of the p-type semiconductor region 160 may be set to a proper value by calculating a depletion layer width from the impurity concentration of each semiconductor region, the voltage value to be applied, and the like in consideration of a reduction in a dark current and the driving power of the transistor. For example, the length is set to about 0.4 μm to 0.8 μm. The length from the end portion of the gate electrode 22 to the end portion of the p-type semiconductor region 160 can also be regarded as the length of the portion, of the p-type semiconductor region 130, which is located between the gate electrode 22 and the p-type semiconductor region 160.

Third Embodiment

Figure 5:
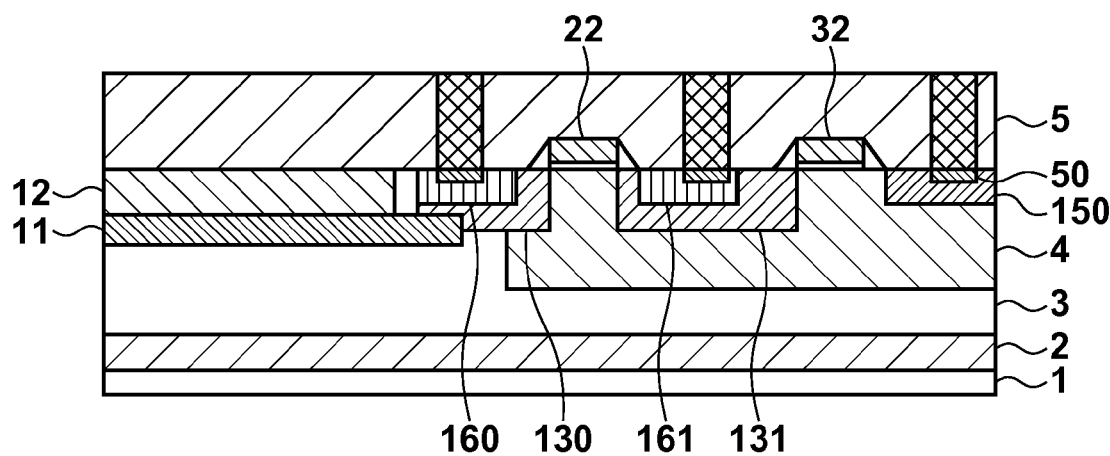
FIG. 5 is a view showing an example of the arrangement of a photoelectric conversion device according to the third embodiment.

The third embodiment will be described with reference to FIG. 5. In this embodiment, a p-type semiconductor region 161 (eighth semiconductor region) having a higher impurity concentration than a p-type semiconductor region 131 is arranged in the p-type semiconductor region 131. The p-type semiconductor region 131 is formed to extend from the surface of the semiconductor substrate to a deeper region than the p-type semiconductor region 161. In addition, as shown in FIG. 5, the p-type semiconductor region 161 is formed to be offset to the gate electrode 22 side of a MOS transistor 102 with respect to a gate electrode 32 of a MOS transistor 103. That is, the p-type semiconductor region 161 is offset to the fourth semiconductor region and located apart from the sixth semiconductor region. Part of the p-type semiconductor region 131 which has a lower impurity concentration than the p-type semiconductor region 161 is arranged in a region, of the MOS transistor 103, which serves as a source. This suppresses a dark current flowing in the MOS transistor 103. Forming a contact plug on the p-type semiconductor region 161 having a high impurity concentration will achieve good electrical connection to the source of the MOS transistor 103. The p-type semiconductor region 161 can be formed by, for example, forming a resist having an opening corresponding to a portion, of the p-type semiconductor region 131, on which the p-type semiconductor region 161 is to be formed, and then implanting boron ions or the like.

The length from an end portion of the gate electrode 32 to an end portion of the p-type semiconductor region 161 can be set in the same manner as the length from the end portion of the gate electrode 22 to the end portion of the p-type semiconductor region 160 in the second embodiment.

Fourth Embodiment

Figure 6:
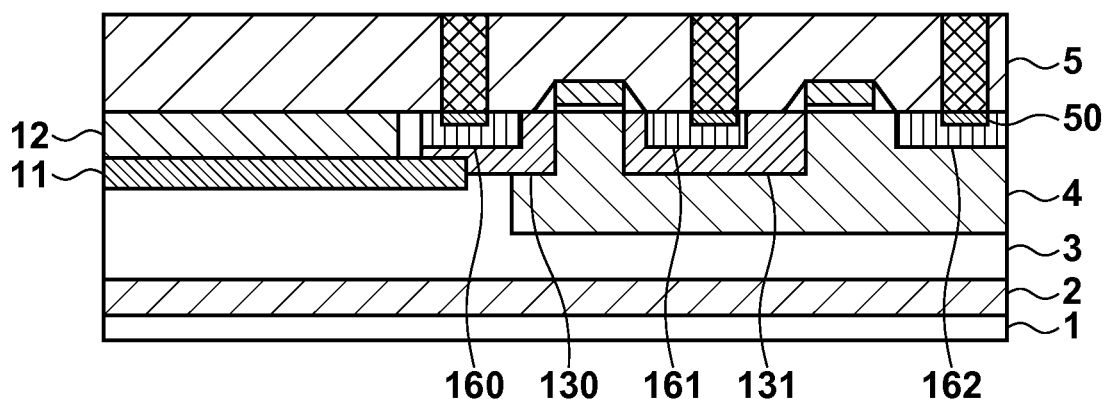
FIG. 6 is a view showing an example of the arrangement of a photoelectric conversion device according to the fourth embodiment.

A method of reducing the number of manufacturing steps according to the fourth embodiment will be described with reference to FIG. 6. In this embodiment, when p-type semiconductor regions 160 and 161 are formed, a p-type semiconductor region 162 having a high impurity concentration is formed together with the p-type semiconductor regions 160 and 161 by simultaneously implanting boron ions or the like into a region where the p-type semiconductor region 150 in the first embodiment is to be formed. This makes it possible to reduce the number of steps (the step concerning FIG. 3H) in forming the p-type semiconductor region 150.

Fifth Embodiment

Figure 7:
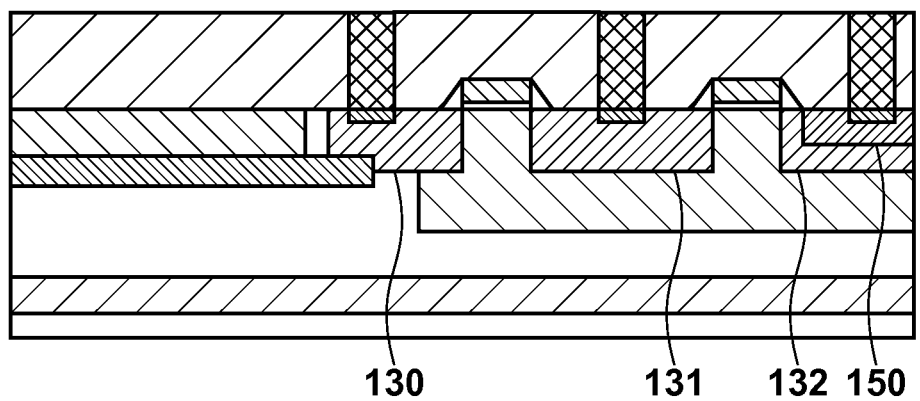
FIG. 7 is a view showing an example of the arrangement of a photoelectric conversion device according to the fifth embodiment.

The fifth embodiment will be described with reference to FIG. 7. In this embodiment, a p-type semiconductor region 132 as a ninth semiconductor region having a lower impurity concentration than a p-type semiconductor region 150 is arranged around the p-type semiconductor region 150. The p-type semiconductor region 132 is formed to a deeper region than the p-type semiconductor region 150. The p-type semiconductor region 132 can reduce the electric field between the drain and a gate 32 of a MOS transistor 103. This makes it possible to suppress a dark current originating from the drain. In addition, since the source of the MOS transistor 103 is a region having a low impurity concentration, a dark current in the source of the MOS transistor 103 is suppressed. The p-type semiconductor region 132 may be formed in the same process as that of forming p-type semiconductor regions 130 and 131.

Sixth Embodiment

Figure 8:
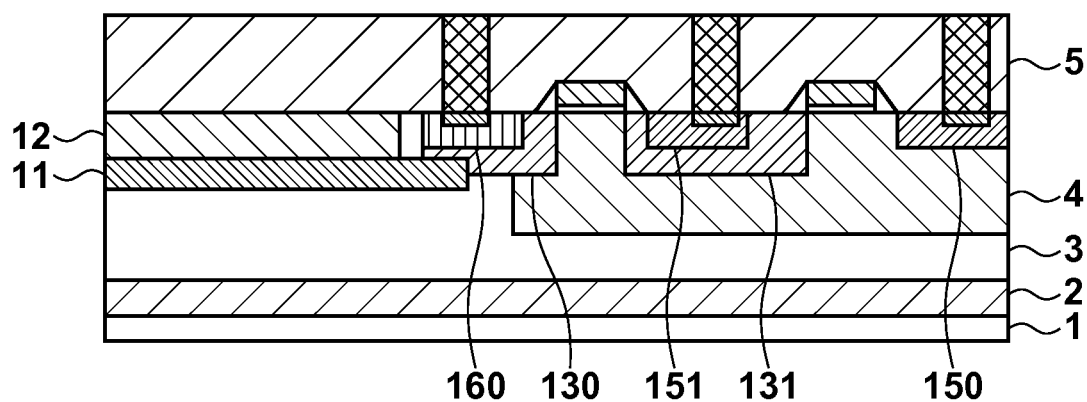
FIG. 8 is a view showing an example of the arrangement of a photoelectric conversion device according to the sixth embodiment.

The sixth embodiment will be described with reference to FIG. 8. A p-type semiconductor region 151 having a higher impurity concentration than a p-type semiconductor region 131 is formed in a region shallower than the p-type semiconductor region 131. The p-type semiconductor region 151 may be formed together with a p-type semiconductor region 150 in the process of forming the p-type semiconductor region 150 by forming an opening in a resist which corresponds to a region where the p-type semiconductor region 151 is to be formed. As a result, since the p-type semiconductor region 151 can be formed as a p-type semiconductor region having an impurity concentration as high as that of the p-type semiconductor region 150, driving power can be increased by decreasing the drain resistance of a MOS transistor 102. In addition, forming a contact plug on the p-type semiconductor region 151 will ensure electrical connection between the drain of the MOS transistor 102 and the contact plug. Since the p-type semiconductor region 151 is offset to a gate electrode 22 with respect to a gate electrode 32 like the p-type semiconductor region 161 in the third embodiment, the source of a MOS transistor 103 becomes a region having a low impurity concentration. This suppresses a dark current in the source of the MOS transistor 103.

Seventh Embodiment

Figure 9:
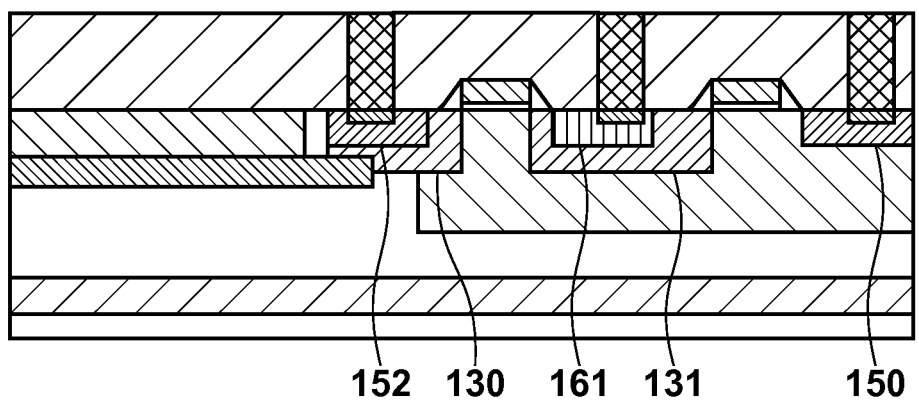
FIG. 9 is a view showing an example of the arrangement of a photoelectric conversion device according to the seventh embodiment.

Referring to FIG. 9, a p-type semiconductor region 152 having a higher impurity concentration than a p-type semiconductor region 130 serving as the source of a MOS transistor 102 is formed in a region shallower than the p-type semiconductor region 130. The p-type semiconductor region 152 can be formed together with the p-type semiconductor region 150 when it is formed. Since the impurity concentration of the p-type semiconductor region 152 can be increased to be as high as that of a p-type semiconductor region 150, the resistance of the source can be decreased. This increases the driving power of the MOS transistor 102. In addition, arranging a contact plug on the p-type semiconductor region 152 will ensure electrical connection.

Eighth Embodiment

The eighth embodiment will be described next with reference to FIG. 10. In this embodiment, p-type semiconductor regions 151 and 152 having an impurity concentration similar to that of a p-type semiconductor region 150 are arranged in the regions where the p-type semiconductor regions 160 and 161 in the third embodiment (FIG. 5) are arranged. Contact plugs are arranged on the p-type semiconductor regions 151 and 152. The p-type semiconductor regions 151 and 152 can be formed by implanting ions into the regions where the p-type semiconductor regions 151 and 152 are to be formed, at the same time when the p-type semiconductor region 150 is formed. Forming the p-type semiconductor regions 151 and 152 together with the p-type semiconductor region 150 can reduce the number of steps as compared with a case in which they are separately formed. In addition, since the impurity concentration of the p-type semiconductor regions 151 and 152 can be set to be higher than that of p-type semiconductor regions 130 and 131, it is possible to reliably electrically connect a photoelectric conversion element 101, the drain of a MOS transistor 102, and a contact plug to each other. In addition, it is possible to increase the driving power by decreasing the drain resistance of the MOS transistor 102.

Ninth Embodiment

The ninth embodiment will be described with reference to FIG. 11. In this embodiment, as in the second embodiment shown in FIG. 4, a p-type semiconductor region 160 having a higher impurity concentration than a p-type semiconductor region 130 is arranged in a region shallower than the p-type semiconductor region 130. In addition, as in the fifth embodiment shown in FIG. 7, a p-type semiconductor region 132 having a lower impurity concentration than a p-type semiconductor region 150 is arranged in a deeper region around the p-type semiconductor region 150. Providing a contact plug on the p-type semiconductor region 160 can ensure electrical connection to a photoelectric conversion element 101. In addition, since the electric field at the drain of a MOS transistor 103 can be reduced, this embodiment has an effect of suppressing a dark current. It is possible to form the respective p-type semiconductor regions 150 and 160 by forming the p-type semiconductor region 130, a p-type semiconductor region 131, and the p-type semiconductor region 132 together, covering the regions with a resist having openings corresponding to portions where the p-type semiconductor regions 150 and 160 are to be formed, and then performing ion implantation.

10th Embodiment

As shown in FIG. 12, in the 10th embodiment, in the photoelectric conversion device according to the third embodiment, a p-type semiconductor region 132 having a lower impurity concentration than a p-type semiconductor region 150 is arranged in a deeper region around the p-type semiconductor region 150 as in the fifth embodiment. According to the 10th embodiment, it is possible to achieve reliable electrical connection between a photoelectric conversion element 101, the source of a MOS transistor 103, and a contact plug. In addition, it is possible to reduce the electric field at the source and drain of the MOS transistor 103. This is effective in suppressing a dark current.

11th Embodiment

The 11th embodiment will be described with reference to FIG. 13. P-type semiconductor regions 160, 161, and 162 having a high impurity concentration are arranged in p-type semiconductor regions 130, 131, and 132. The p-type semiconductor regions 160, 161, and 162 are offset with respect to gate electrodes 22 and 32 and constitute a symmetrical structure. This reduces the electric field generated at the sources of the MOS transistors 102 and 103, and also reduces the electric field generated at the drains. This provides an effect of suppressing a dark current.

12th Embodiment

The photoelectric conversion device according to each embodiment described above can be applied to an imaging system such as a camera. The imaging system includes an apparatus mainly aimed at imaging and an apparatus such as a portable terminal or computer having an imaging function. The imaging system includes a solid-state image sensor including the photoelectric conversion device according to the present invention and a processing unit which processes the signal output from the solid-state image sensor. The solid-state image sensor may include an A/D converter. The processing unit performs compression processing and the like for signals from, for example, the solid-state image sensor.

The present invention is not limited to the above embodiments. The present invention can be changed, as needed, in accordance with objects, states, applications, functions, and other specifications, and can be implemented by other embodiments. For example, each embodiment described above has exemplified the circuit shown in FIG. 1 as an example of the arrangement of a photoelectric conversion device. However, the photoelectric conversion device is not limited to this arrangement, and may use other known arrangements. For example, the photoelectric conversion device may use an arrangement including a photoelectric conversion element and a transfer transistor which transfers electric charges generated by the photoelectric conversion element to a semiconductor region (floating diffusion). In addition, in each embodiment described above, the impurity concentration of each p-type semiconductor region forming a drain electrode is set low. However, part of the p-type semiconductor region near an end portion of the gate electrode may be replaced with an n-type semiconductor region.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-154961, filed Jul. 25, 2013, which is hereby incorporated by reference herein in its entirety.

What is claimed is:
1. A photoelectric conversion device comprising:
a photoelectric conversion element provided in a semiconductor substrate and including a first semiconductor region of a first conductivity type;
a second semiconductor region of the first conductivity type which is provided in contact with the first semiconductor region;
a third semiconductor region of the first conductivity type which is provided at a position apart from the second semiconductor region;
a fourth semiconductor region of a second conductivity type different from the first conductivity type which is provided between the second semiconductor region and the third semiconductor region;
a fifth semiconductor region of the first conductivity type which is provided at a position apart from the third semiconductor region;
a sixth semiconductor region of the second conductivity type which is provided between the third semiconductor region and the fifth semiconductor region;
a first gate electrode provided on an insulation film on the fourth semiconductor region; and
a second gate electrode provided on an insulation film on the sixth semiconductor region, wherein an impurity concentration of the third semiconductor region is lower than that of the fifth semiconductor region, and a depth of a lower-edge of the third semiconductor region from a surface of the semiconductor substrate is larger than a depth of a lower-edge of the fifth semiconductor region from the surface of the semiconductor substrate.

2. The device according to claim 1, wherein a seventh semiconductor region of the first conductivity type which has a higher impurity concentration than the second semiconductor region is arranged in the second semiconductor region.

3. The device according to claim 1, wherein an eighth semiconductor region of the first conductivity type which has a higher impurity concentration than the third semiconductor region is arranged in the third semiconductor region.

4. The device according to claim 1, wherein lower-edges of the second semiconductor region and the third semiconductor region are shallower than a lower-edge of the first semiconductor region.

5. The device according to claim 1, wherein lower-edges of the second semiconductor region and the third semiconductor region are deeper than a lower-edge of the fifth semiconductor region.

6. The device according to claim 1, wherein impurity concentrations of the second semiconductor region and the third semiconductor region are higher than that of the first semiconductor region.

7. The device according to claim 1, wherein the seventh semiconductor region of the first conductivity type which has a higher impurity concentration than the second semiconductor region is arranged in the second semiconductor region,
the eighth semiconductor region of the first conductivity type which has a higher impurity concentration than the third semiconductor region is arranged in the third semiconductor region,
lower-edges of the second semiconductor region and the third semiconductor region are shallower than a lower-edge of the first semiconductor region and deeper than a lower-edge of the fifth semiconductor region,
an impurity concentration of the second semiconductor region and the third semiconductor region is higher than that of the first semiconductor region and lower than an impurity concentration of the seventh semiconductor region and the eight semiconductor region; and
an impurity concentration of the fifth semiconductor region is higher than that of the seventh semiconductor region and the eighth semiconductor region.

8. The device according to claim 1, wherein a ninth semiconductor region having a lower impurity concentration than the fifth semiconductor region is arranged around the fifth semiconductor region.

9. The device according to claim 1, wherein the fifth semiconductor region is in contact with a contact plug.

10. The device according to claim 1, wherein there is a period in which the first gate electrode is turned on, and the second gate electrode is turned off.

11. An imaging system comprising:
a solid-state image sensor including a photoelectric conversion device defined in claim 1; and
a processing unit configured to process a signal output from the solid-state image sensor.

12. A photoelectric conversion device comprising:
a first semiconductor region of a first conductivity type provided in a semiconductor substrate and forming a photoelectric conversion element;
a second semiconductor region of the first conductivity type which is provided in contact with the first semiconductor region;
a third semiconductor region of the first conductivity type which is provided at a position apart from the second semiconductor region;
a fourth semiconductor region of a second conductivity type different from the first conductivity type which is provided between the second semiconductor region and the third semiconductor region;
a fifth semiconductor region of the first conductivity type which is provided at a position apart from the third semiconductor region;
a sixth semiconductor region of the second conductivity type which is provided between the third semiconductor region and the fifth semiconductor region;
a first gate electrode provided on an insulation film on the fourth semiconductor region; and
a second gate electrode provided on an insulation film on the sixth semiconductor region,
wherein a depth of a lower-edge of the third semiconductor region from a surface of the semiconductor substrate is larger than a depth of a lower-edge of the fifth semiconductor region from the surface of the semiconductor substrate.

13. The device according to claim 12, wherein the third semiconductor region and the fifth semiconductor region are formed by ion implantation.

14. The device according to claim 12, wherein there is a period in which the first gate electrode is turned on, and the second gate electrode is turned off.

15. An imaging system comprising:
a solid-state image sensor including a photoelectric conversion device defined in claim 12; and
a processing unit configured to process a signal output from the solid-state image sensor.

* * * * *